(12) United States Patent
Zou et al.

(10) Patent No.: US 11,758,654 B2
(45) Date of Patent: Sep. 12, 2023

(54) CIRCUIT SUBSTRATE, CHIP, SERIES CIRCUIT, CIRCUIT BOARD AND ELECTRONIC DEVICE

(71) Applicant: BITMAIN DEVELOPMENT PTE. LTD., Singapore (SG)

(72) Inventors: Tong Zou, Hong Kong (HK); Wenjie Cheng, Hong Kong (HK)

(73) Assignee: BITMAIN DEVELOPMENT PTE. LTD., Singapore (SG)

( * ) Notice: Subject to any disclaimer, the term of this patent is extended or adjusted under 35 U.S.C. 154(b) by 205 days.

(21) Appl. No.: 16/758,774

(22) PCT Filed: Feb. 28, 2019

(86) PCT No.: PCT/CN2019/076545
§ 371 (c)(1),
(2) Date: Apr. 23, 2020

(87) PCT Pub. No.: WO2019/196569
PCT Pub. Date: Oct. 17, 2019

(65) Prior Publication Data
US 2021/0161011 A1 May 27, 2021

(30) Foreign Application Priority Data

Apr. 9, 2018 (CN) .......................... 201810312401.9
Apr. 9, 2018 (CN) .......................... 201810312436.2

(51) Int. Cl.
*H01L 23/48* (2006.01)
*H05K 1/11* (2006.01)
(Continued)

(52) U.S. Cl.
CPC ........ *H05K 1/114* (2013.01); *H01L 23/49816* (2013.01); *H01L 23/49822* (2013.01);
(Continued)

(58) Field of Classification Search
CPC ......... H01L 23/49816; H01L 23/49838; H01L 23/49822; H05K 1/114; H05K 1/181; H05K 2201/094
(Continued)

(56) References Cited

U.S. PATENT DOCUMENTS 5,468,999 A * 11/1995 Lin ........................ H01L 24/06
257/784
5,691,568 A * 11/1997 Chou ................ H01L 23/49838
257/691
(Continued)

FOREIGN PATENT DOCUMENTS

CN          102446772 A      5/2012
CN          103369826 A     10/2013
(Continued)

OTHER PUBLICATIONS

The World Intellectual Property Organization (WIPO) International Search Report for PCT/CN2019/076545 dated Jun. 3, 2019 5 Pages.

*Primary Examiner* — Nitin Parekh
(74) *Attorney, Agent, or Firm* — ANOVA LAW GROUP, PLLC

(57) ABSTRACT

The present invention discloses a circuit substrate including an insulation layer; a metal layer disposed on a first surface of the insulation layer; and a first solder pad and a second solder pad disposed on a second surface of the insulation layer opposite the metal layer. Shortest distances between soldering dots on the metal layer and a projected area of the first solder pad on the metal layer are shorter than a distance threshold, the shortest distance being a minimum value of vertical distances between each of the soldering dots on the metal layer and a side edge of the projected area of the first solder pad on the metal layer. The soldering dots on the metal layer correspond one-to-one to soldering dots on a (Continued)

corresponding die; and the side edge is adjacent to a projected area of the second solder pad on the metal layer.

16 Claims, 14 Drawing Sheets

(51) Int. Cl.
*H01L 23/498* (2006.01)
*H05K 1/18* (2006.01)

(52) U.S. Cl.
CPC ....... *H01L 23/49838* (2013.01); *H05K 1/181* (2013.01); *H05K 2201/094* (2013.01)

(58) Field of Classification Search
USPC .......................................... 257/779, 783, 786
See application file for complete search history.

(56) References Cited

U.S. PATENT DOCUMENTS

| | | | | |
|---|---|---|---|---|
| 6,064,113 | A * | 5/2000 | Kirkman | H01L 24/49 |
| | | | | 257/691 |
| 6,204,559 | B1 * | 3/2001 | Lin | H01L 23/4985 |
| | | | | 257/691 |
| 6,242,815 | B1 * | 6/2001 | Hsu | H01L 23/4985 |
| | | | | 257/784 |
| 6,724,638 | B1 * | 4/2004 | Inagaki | H05K 1/186 |
| | | | | 257/E23.079 |
| 6,897,555 | B1 * | 5/2005 | Lim | H01L 24/49 |
| | | | | 257/E23.079 |
| 6,952,049 | B1 * | 10/2005 | Ogawa | H01L 23/642 |
| | | | | 257/700 |
| 8,106,516 | B1 * | 1/2012 | Lacap | H01L 23/50 |
| | | | | 257/772 |
| 2003/0047348 | A1 * | 3/2003 | Jessep | H01L 23/49827 |
| | | | | 174/250 |
| 2005/0023677 | A1 * | 2/2005 | Zhao | H01L 23/49816 |
| | | | | 257/E23.105 |
| 2010/0139964 | A1 | 6/2010 | An et al. | |
| 2011/0084410 | A1 * | 4/2011 | Yoon | H01L 23/49816 |
| | | | | 257/784 |
| 2011/0248399 | A1 * | 10/2011 | Pendse | H01L 24/09 |
| | | | | 257/737 |
| 2013/0180772 | A1 * | 7/2013 | Inoue | H05K 3/4007 |
| | | | | 228/256 |

FOREIGN PATENT DOCUMENTS

| | | |
|---|---|---|
| CN | 108463050 A | 8/2018 |
| CN | 108601211 A | 9/2018 |

* cited by examiner

CIRCUIT SUBSTRATE, CHIP, SERIES CIRCUIT, CIRCUIT BOARD AND ELECTRONIC DEVICE

CROSS-REFERENCES TO RELATED APPLICATIONS

This application is a national phase entry under 35 U.S.C § 371 of International Application No. PCT/CN2019/076545, filed on Feb. 28, 2019, which claims priority of Chinese Patent Application No. 201810312401.9, filed with the State Intellectual Property Office of P. R. China on Apr. 9, 2018 and Chinese Patent Application No. 201810312436.2, filed with the State Intellectual Property Office of P. R. China on Apr. 9, 2018, the entire contents of all of which are incorporated herein by reference.

FIELD OF THE DISCLOSURE

The present invention relates to the field of chip design technology; more particularly, it relates to a circuit substrate, a chip, a circuit, a circuit board, and an electronic device.

BACKGROUND

FIG. 1 illustrates a projected view of various components on a metal layer of a circuit substrate. In particular, as shown in FIG. 1, the traditional circuit substrate may include an insulation layer 10 (not shown), a metal layer 11 configured on a first surface of the insulation layer 10, and a plurality of solder pads configured on a second surface of the insulation layer 10. The first surface and the second surface are opposite of each other. The plurality of solder pads includes power supply input solder pads 12 (i.e., VDD pads), power supply output solder pads 13 (i.e., VSS pads, aka GND pads) and signal input/output solder pads 14 (i.e., IO pads).

Often, such circuit substrates have problems stemming from unbalanced power supply voltages at the soldering dots on the metal layer. Because distances between soldering dots on the metal layer and the power supply input solder pad are different and vary substantially, voltage differences at different soldering dots on the metal layer are substantial and are difficult to balance.

BRIEF SUMMARY OF THE DISCLOSURE

To solve the problem of the existing technology, the embodiments of the present invention provide a circuit substrate, a chip, a series circuit, a circuit board and an electronic device.

One aspect of the present disclosure provides a circuit substrate including an insulation layer; a metal layer disposed on a first surface of the insulation layer; and a first solder pad and a second solder pad disposed on a second surface of the insulation layer opposite the metal layer. Shortest distances between soldering dots on the metal layer and a projected area of the first solder pad on the metal layer are all shorter than a distance threshold, the shortest distance being a minimum value of vertical distances between each of the soldering dots on the metal layer and a side edge of the projected area of the first solder pad on the metal layer. The soldering dots on the metal layer correspond one-to-one to soldering dots on a corresponding die; and the side edge is adjacent to a projected area of the second solder pad on the metal layer.

Another aspect of the present disclosure provides another circuit substrate. The circuit substrate includes: a first insulation layer; a metal layer disposed on a first surface of the first insulation layer; a first solder pad; and a second solder pad disposed on a second surface of the first insulation layer opposite the metal layer. At least two soldering dots are disposed in a projected area of the second solder pad on the metal layer and correspond one-to-one to soldering dots on a corresponding die; and the first solder pad is disposed on at least one surface or at least two sides of the second solder pad.

Another aspect of the present disclosure provides a chip. The chip includes: a die; and a circuit substrate. The circuit substrate comprises: an insulation layer; a metal layer disposed on a first surface of the insulation layer; and a first solder pad and a second solder pad disposed on a second surface of the insulation layer opposite the metal layer. Shortest distances between soldering dots on the metal layer and a projected area of the first solder pad on the metal layer are all shorter than a distance threshold, the shortest distance being a minimum value of vertical distances between the soldering dots on the metal layer and a side edge of the projected area of the first solder pad on the metal layer. The die is disposed on a surface of the metal layer opposite the insulation layer. The soldering dots on the metal layer correspond one-to-one to soldering dots on the die. The side edge is adjacent to a projected area of the second solder pad on the metal layer.

Another aspect of the present disclosure provides a series circuit. The series circuit includes: at least two chip sets connected in parallel with each other. Each chip set includes at least two disclosed chips, connected in series with each other.

Another aspect of the present disclosure provides a circuit board. The circuit board includes a disclosed series circuit.

Another aspect of the present disclosure provides an electronic device. The electronic device includes a disclosed circuit board.

Another aspect of the present disclosure provides another electronic device. The electronic device includes: a body of the electronic device; and a disclosed chip.

The additional aspects and advantages of the present disclosure will be set forth in part in the description below, parts of which will become apparent from the description below or will be understood by the practice of the present disclosure.

BRIEF DESCRIPTION OF THE DRAWINGS

In order to more clearly illustrate the technical solutions in the embodiments of the present invention, drawings used in the description of the embodiments will be briefly described below. The drawings in the following description are only some embodiments of the present invention. Other drawings may also be obtained by those of ordinary skill in the art without inventive work.

DETAILED DESCRIPTION

To make the objectives, technical solutions, and advantages of the present invention clearer, the following further describes the embodiments of the present invention in details with reference to the accompanying drawings.

Figure 1:
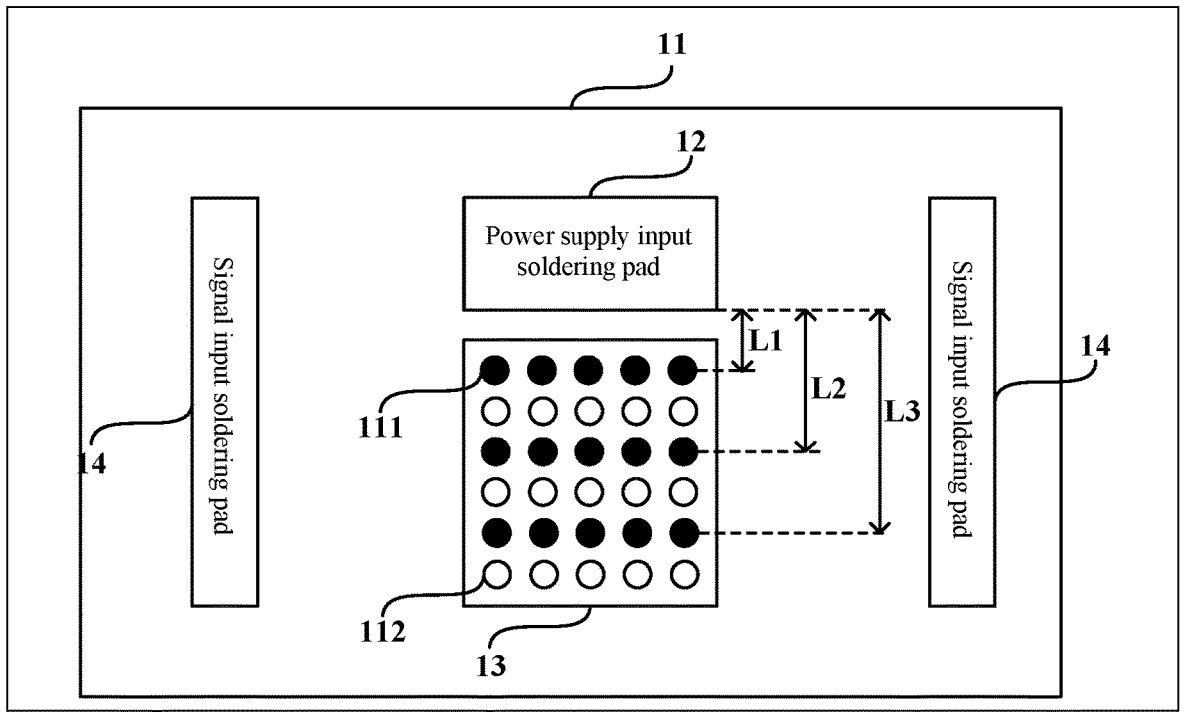
FIG. 1 illustrates a projected view of various components on a metal layer of a traditional circuit substrate.

Referring to FIG. 1, existing power supply output solder pads 13 include corresponding soldering dots disposed in the projected area on the metal layer 11, such as power supply input soldering dots 111 (i.e., VDD bump) capable of one-to-one connection to die input soldering dots (not shown), and power supply output soldering dots 112 (i.e., VSS bump) capable of one-to-one connection to die output soldering dots. Further, as shown in FIG. 1, existing power supply input solder pads 12 are often configured on one side of power supply output solder pads 13 to supply voltages to the power supply input soldering dots on the metal layer 11.

However, based on the equation $R=\rho L/S$ (where R stands for a resistance value, p stands for a resistivity, L stands for a length, and S stands for an cross-section area), because distances between soldering dots on the metal layer 11 and the power supply input solder pad 12 are different and vary substantially, voltage differences at different soldering dots on the metal layer are substantial and are difficult to balance.

Figure 2A:
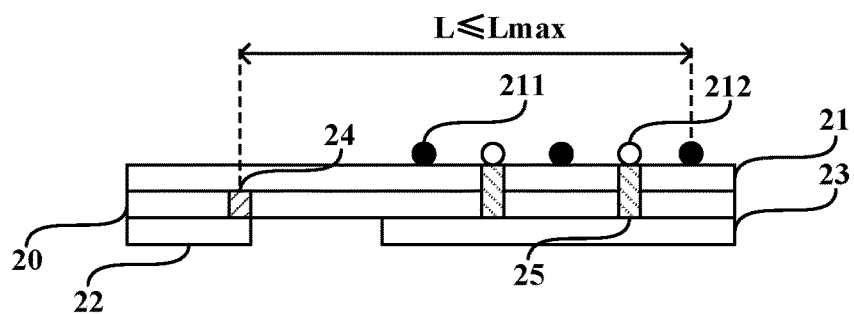
FIG. 2A illustrates a cross-sectional view of an exemplary circuit substrate according to disclosed embodiments.

To ensure that the voltages at various soldering dots on a circuit substrate are balanced with each other such that the entire circuit substrate can operate properly, the present disclosure provides a design for a circuit substrate. FIG. 2A illustrates a cross-sectional view of an exemplary circuit substrate according to the present disclosure. The cross-sectional view may be any cross-sectional view that can clearly represent relative positions among various components on the circuit substrate and is not limited by the present disclosure.

In one embodiment, as shown in FIG. 2A, the circuit substrate may include a first insulation layer 20, a metal layer 21, a first solder pad 22, and a second solder pad 23. The metal layer 21 is disposed on a first surface of the first insulation layer 20. The first solder pad 22 and the second solder pad 23 are disposed on a second surface of the first insulation layer 20. The first surface and the second surface of the first insulation layer 20 are opposite to each other.

As shown in FIG. 2A, a shortest distance between soldering dots (e.g., soldering dots 211 or 212 in FIG. 2A) on the metal layer 21 and a projected area of the first solder pad 22 on the metal layer 21 is smaller than a distance threshold (e.g., $L_{max}$ in FIG. 2A). The soldering dots on the metal layer 21 are one-to-one corresponding to soldering dots on a die. As shown in FIG. 1, a shortest distance is a minimum value (e.g., L1) of vertical distances (e.g., L1, L2, L3) between the soldering dots and a side edge of the projected area of the first solder pad 22 on the metal layer 21. In this case, the side edge of the projected area of the first solder pad 22 on the metal layer 21 is a side edge adjacent to the projected area of the second solder pad 23 on the metal layer 21.

In one embodiment, the distance threshold is a farthest distance from the soldering dots to the projected area of the first solder pad 22 on the metal layer 21. The farthest distance is a maximum value of vertical distances between the soldering dots and a side edge of the projected area of the first solder pad 22 on the metal layer 21. The side edge is adjacent to the projected area of the second solder pad 23 on the metal layer 21.

In one embodiment, the threshold distance may be a maximum value of distances between the soldering dots and the center of the first solder pad 22 or the center of the projected area of the first solder pad 22 on the metal layer 21. The threshold distance may also be a maximum value of vertical distances between the center of a shape formed by the soldering dots or the center of the projected area of the die on the metal layer 21 and the side edge of the projected area of the first solder pad 22 on the metal layer 21. The specific threshold distance value may be configured according to actual requirements, at 5 mm, 8 mm, 1 cm or 2 cm, etc., as long as design requirements are satisfied. The present disclosure does not limit the distance threshold.

In the embodiments of the present disclosure, the shortest distances (e.g., straight lines) between the soldering dots on the metal layer 21 and the projected area of the first solder pad 22 on the metal layer 21 are all smaller than the distance threshold. As such, equivalent resistances between the first solder pad 22 and the soldering dots on the metal layer 21 are substantially small, and voltage drops between the first solder pad 22 and the soldering dots on the metal layer 21 are substantially small. Thus, the voltages at the soldering dots on the metal layer 21 are balanced between each other and the normal operation of the circuit substrate is ensured.

In one embodiment, at least one power supply input soldering dot 211 and at least one power supply output soldering dot 212 may be disposed on the metal layer 21. Further, the power supply input soldering dot 211 is often physically or electrically connected to a corresponding input soldering dot (i.e., VDD bump) of the die, and the power supply output soldering dot 212 is often physically or electrically connected to a corresponding output soldering dot (i.e., VSS bump) of the die.

In one embodiment, the power supply input soldering dot 211 and the power supply output soldering dot 212 in different areas may correspond to different dies. For example, as depicted in FIG. 2A, a plurality of soldering dots (including the power supply input soldering dots 211 and the power supply output soldering dots 212) in the upper left corner may correspond to a first die. A plurality of soldering dots (including the power supply input soldering dots 211 and the power supply output soldering dots 212) in the upper right corner may correspond to a second die. A plurality of soldering dots (including the power supply input soldering dots 211 and the power supply output soldering dots 212) in the lower left corner may correspond to a third die. A plurality of soldering dots (including the power supply input soldering dots 211 and the power supply output soldering dots 212) in the lower right corner may correspond to a fourth die.

Further, a plurality of cores may be configured on a die. Each core may include at least one power supply input soldering dot 211 and an equal number of the power supply output soldering dots 212. As such, the power supply input soldering dots 211 and the power supply output soldering dots 212 in different areas may correspond to different cores in a same die. For example, as depicted in FIG. 2A, a plurality of soldering dots (including the power supply input soldering dots 211 and the power supply output soldering dots 212) in the upper left corner may correspond to a first core. A plurality of soldering dots (including the power supply input soldering dots 211 and the power supply output soldering dots 212) in the upper right corner may correspond to a second core. A plurality of soldering dots (including the power supply input soldering dots 211 and the power supply output soldering dots 212) in the lower left corner may correspond to a third core. A plurality of soldering dots (including the power supply input soldering dots 211 and the power supply output soldering dots 212) in the lower right corner may correspond to a fourth core.

In addition, a shape formed by a group of the power supply input/output soldering dots may be the same as the projected area of the corresponding die on the metal layer 21. In one embodiment, the shape formed by a group of the power supply input/output soldering dots may be the same as a shape formed by the soldering dots on the corresponding die. The present disclosure does not limit the shape of the power supply input/output soldering dots.

In one embodiment, as shown in FIG. 2A, the first solder pad 22 may be physically or electrically connected to the power supply input soldering dots 211 through a first through-hole 24. The power supply input soldering dots 211 disposed on the metal layer 21 are connected to the metal layer 21. The second solder pad 23 may be physically or electrically connected to the power supply output soldering dots 212 through a second through-hole 25. In practical applications, a current may flow through the first solder pad 22, the first through-hole 24, the metal layer 21, the power supply input soldering dots 211, and the input soldering dots of the corresponding die to relevant components on the die, such as MOS transistors, etc. Then, the current may flow through the output soldering dots of the die, the power supply output soldering dots 212, the second through-hole 25, and the second solder pad 23 to the ground.

In one embodiment, the first solder pad 22 is connected to the metal layer 21 through the first through-hole 24. The distances between the soldering dots on the metal layer 21 and a position of the first through-hole 24 on the metal layer 21 are all smaller than the distance threshold.

In one embodiment, the first solder pad 22 is connected to the metal layer 21 through the first through-hole 24. When the first solder pad 22 is configured on at least one surface of the second solder pad 23, the distances between the soldering dots on the metal layer 21 and the position of the first through-hole 24 on the meal layer 21 are all no greater than the distance threshold.

In one embodiment, the first solder pad 22 is connected to the metal layer 21 through the first through-hole 24. When the first solder pad 22 is configured on at least two sides of the second solder pad 23, the distances between the soldering dots on the metal layer 21 and the position of the first through-hole 24 on the metal layer 21 are all smaller than the distance threshold.

In one embodiment, the distance threshold is the farthest distance between the soldering dots and the projected area of the first solder pad 22 on the metal layer 21. The farthest distance is the maximum value of the vertical distances between the soldering dots and the side edge of the projected area of the first solder pad 22 on the metal layer 21. The side edge is adjacent to the projected area of the second solder pad 23 on the metal layer 21.

When multiple circuit substrates (substrates configured with multiple corresponding dies) are connected in series with each other, an output voltage of the second solder pad 23 is often non-zero and will be an input voltage of a subsequent circuit substrate. In this case, only the output voltage of the very last circuit substrate is zero. The present disclosure does not limit the configuration of multiple circuit substrates.

Figure 2B:
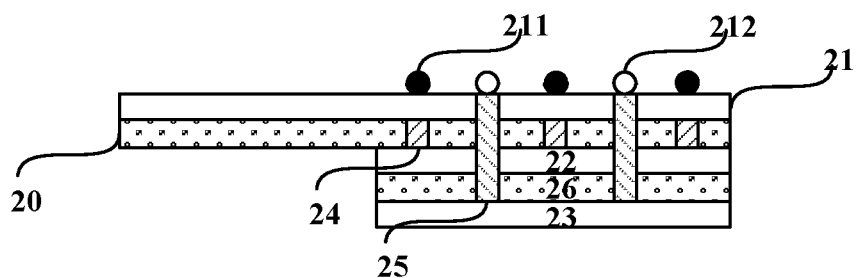
FIG. 2B illustrates a cross-sectional view of another exemplary circuit substrate according to disclosed embodiments.

Further, FIG. 2B illustrates a cross-sectional view of another exemplary circuit substrate according to the present disclosure. As shown in FIG. 2B, the circuit substrate may also include a second insulation layer 26 disposed between the first solder pad 22 and the second solder pad 23. The first solder pad 22 is disposed on a first surface of the second solder pad 23 facing toward the metal layer 21.

For example, as shown in FIG. 2B, the first solder pad 22 is disposed between the metal layer 21 and the second solder pad 23. The first insulation layer 20 is disposed between the metal layer 21 and the first solder pad 22. The second insulation layer 26 is disposed between the first solder pad 22 and the second solder pad 23. The first through-hole 24 is disposed through the first insulation layer 20 to transport the current between the power supply input soldering dots 211 on the metal layer 21 and the first solder pad 22. The second through-hole 25 is disposed through the first insulation layer 20, the first solder pad 22, and the second insulation layer 26 to transport the current between the power supply output soldering dots 212 on the metal layer 21 and the second solder pad 23.

Figure 2C:
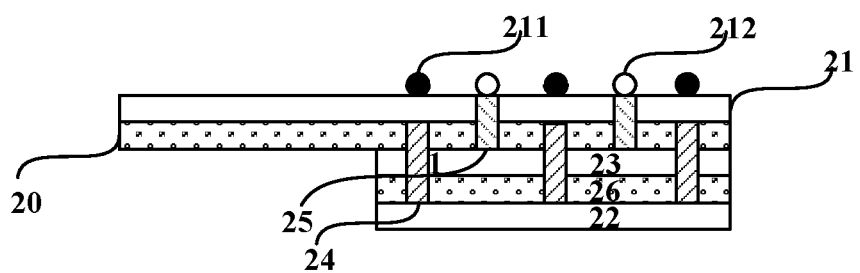
FIG. 2C illustrates a cross-sectional view of another exemplary circuit substrate according to disclosed embodiments.

Further, FIG. 2C illustrates a cross-sectional view of another exemplary circuit substrate according to the present disclosure. As shown in FIG. 2C, the circuit substrate may also include the second insulation layer 26 disposed between the first solder pad 22 and the second solder pad 23. The first solder pad 22 is disposed on a second surface of the second solder pad 23 opposite the metal layer 21.

For example, as shown in FIG. 2C, the second solder pad 23 is disposed between the metal layer 21 and the first solder pad 22. The first insulation layer 20 is disposed between the metal layer 21 and the second solder pad 23. The second insulation layer 26 is disposed between the second solder pad 23 and the first solder pad 22. The first through-hole 24 is disposed through the first insulation layer 20 to transport the current between the power supply output soldering dots 212 on the metal layer 21 and the second solder pad 23. The second through-hole 25 is disposed through the first insulation layer 20, the second solder pad 23, and the second insulation layer 26 to transport the current between the power supply input soldering dots 211 on the metal layer 21 and the first solder pad 22.

In one embodiment, disposing the first solder pad 22 on at least one surface of the second solder pad 23 refers to the projected area of the first solder pad 22 on the metal layer 21 at least partially overlapping with the projected area of the second solder pad 23 on the metal layer 21 or the projected area of the first solder pad 22 on the metal layer 21 completely overlapping with the projected area of the second solder pad 23 on the metal layer 21.

In one embodiment, when the first solder pad 22 is disposed on at least one surface of the second solder pad 23, the shortest distance between the soldering dots on the metal layer 21 and the side edge of the projected area of the first solder pad 22 on the metal layer 21 is no greater than the distance threshold. The side edge is adjacent to the projected area of the second solder pad 23 on the metal layer 21.

For example, the shortest distance between the power supply input soldering dots on the metal layer 21 and the side edge of the projected area of the first solder pad 22 on the metal layer 21 is no greater than the distance threshold.

In one embodiment, when the first solder pad 22 is disposed on at least two sides of the second solder pad 23, the shortest distance between the soldering dots on the metal layer 21 and the side edge of the projected area of the first solder pad 22 on the metal layer 21 is smaller than the distance threshold. The side edge is adjacent to the projected area of the second solder pad 23 on the metal layer 21.

For example, the shortest distance between the power supply input soldering dots on the metal layer 21 and the side edge of the projected area of the first solder pad 22 on the metal layer 21 is smaller than the distance threshold.

In one embodiment, the first through-hole 24 may include a plurality of through-holes to ensure a complete connection between the first solder pad 22 and the power supply input soldering dots 211 on the metal layer 21. Moreover, a length of the first through-hole 24 may be a thickness of the first insulation layer 20, for example, 50 μm, 20 μm, or 30 μm, etc. The second through-hole 25 may also include a plurality of through-holes to ensure a complete connection between the second solder pad 23 and the power supply output soldering dots 212 on the metal layer 21. Moreover, a length of the second through-hole 25 may be a sum of a thickness of the first insulation layer 20 and a thickness of the metal layer 21, for example, 50 μm+20 μm=70 μm, 20 μm+30 μm=50 μm, or 30 μm+24 μm=54 μm, etc.

In one embodiment, the connection between the first solder pad 22 and the metal layer 21 (i.e., the connection between the first solder pad 22 and the power supply input soldering dots 211) and the connection between the second solder pad 23 and the power supply output soldering dots 212 may be through the through-holes or through other means, such as wires, electromagnetic coupling, etc. The present disclosure does not pose any limitations on the various configurations of the connection between the solder pads.

In one embodiment, the first solder pad 22 may be the power supply input solder pad (i.e., VDD pad) on the circuit substrate. The second solder pad 23 may be the power supply output solder pad (i.e., VSS pad) on the circuit substrate. In another embodiment, the first solder pad 22 may be the corresponding power supply output solder pad, and the second solder pad 23 may be the corresponding power supply input solder pad. In this case, component placement on the circuit substrate may be adjusted accordingly. The present disclosure does not pose any limitations on the configurations of power supply of the solder pads.

In the following embodiments of the present disclosure, the circuit substrate will be described in detail with the assumption that the first solder pad 22 is the power supply input solder pad and the second solder pad 23 is the power supply output solder pad.

It should be noted that there exists an equivalent resistance of the first solder pad 22, the first through-hole 24, and the metal layer 21. When the distance between the first solder pad 22 and the power supply input soldering dots 211 (e.g., the power supply input soldering dots 211 farthest away from the first solder pad 22) is substantially long, i.e., the length of the first through-hole 24 is substantially long, and/or the distance between the first through-hole 24 and the power supply input soldering dots 211 is substantially long, based on the equation R=ρL/S, the combined equivalent resistance between the first solder pad 22 and the power supply input soldering dots 211 may be substantially large.

Further, because the first solder pad 22 is the power supply input solder pad, the voltage thereof is often substantially high, further increasing a voltage drop between the first solder pad 22 and the power supply input soldering dots 211. As such, the voltages on the power supply input soldering dots 211 may be unable to satisfy the actual voltage requirement. For example, assuming that the voltage at the first solder pad 22 is 0.8V and the voltage drop between the first solder pad 22 and the power supply input soldering dots 211 is 0.5V, then the voltage at the power supply input soldering dots 211 is 0.3V. In this case, the voltages at the power supply input soldering dots 211 fartherest away from the first solder pad 22 may not be able to satisfy the actual operation requirement. For example, assuming that a normal operating voltage at the power supply input soldering dots is between 0.4V and 1.0V, and 0.3V<0.4V. Thus, the voltages at the soldering dots may be unbalanced, thereby affecting the normal operation of the entire circuit substrate.

In one embodiment, because the equivalent resistances of the first solder pad 22 and the first through-hole 24 are often small and negligible, the voltage drop between the first solder pad 22 and the power supply input soldering dots 211 is often similar to the voltage drop between the projected area of the first solder pad 22 on the metal layer 21 and the power supply input soldering dots 211. Taking consideration that the first solder pad 22 is connected to the metal layer 21 through the first through-hole 24, the voltage drop between the first solder pad 22 and the power supply input soldering dots 211 may actually be similar to the voltage drop between the position (the position where the metal layer 21 and the connection of the first through-hole 24 are connected) of the first through-hole 24 on the metal layer 21 and the power supply input soldering dots 211.

Generally, because the position of the first through-hole 24 on the first solder pad 22 is located in the periphery of the first solder pad 22, the position of the first through-hole 24 on the metal layer 21 is close to the periphery of the projected area of the first solder pad 22 on the metal layer 21. As such, in one embodiment, the voltage drop between the position of the first through-hole 24 on the metal layer 21 and the power supply input soldering dots 211 may be treated as the voltage drop between the first solder pad 22 and the power supply input soldering dots 211.

In one embodiment, the equivalent resistance between the first solder pad 22 and the power supply input soldering dots 211 may be calculated usually based on the shortest distance between the projected area of the first solder pad 22 on the metal layer 21 and the power supply input soldering dots 211. The voltage drop between the first solder pad 22 and the power supply input soldering dots 211 may further be determined. And the power supply input soldering dots 211 may be safeguarded to operate at the normal voltages. Under the circumstances that a high precision is required, the length of the first through-hole 24 (i.e., the thickness of the first insulation layer 20) and the equivalent resistance of the first solder pad 22 itself may be included in the calculation.

Further, because each power supply input soldering dot 211 on the metal layer 21 may correspond to a unique power supply output soldering dot 212 and each pair of soldering dots (one power supply input soldering dot 211 and the corresponding power supply output soldering dot 212) may correspond to a pair of soldering dots (one first input soldering dot and the corresponding output soldering dot) on the same die, a distance between each pair of the soldering dots is substantially short. Thus, when determining the shortest distance, any soldering dot may be selected to determine the shortest distance between the selected soldering dot and the projected area of the first solder pad 22 on the metal layer 21.

In one embodiment, that the shortest distance between the soldering dots on the metal layer 21 and the projected area of the first solder pad 22 on the metal layer 21 is smaller than the distance threshold may include the shortest distance between the power supp input soldering dots 211 and the projected area of the first solder pad 22 on the metal layer.

During the operation of the circuit substrate, the current may flow through the first solder pad 22, the first through-hole 24, the metal layer 21, the power supply input soldering dots 211, the input soldering dots of the die, internal components of the die, the output soldering dots of the die, the power supply output soldering dots 212, and the second solder pad 23. A connection distance between the soldering dots of the die and the power supply input soldering dots 211 or the power supply output soldering dots 212 is often substantially short and has substantially small resistance. The voltage drop during the current transmission may occur primarily between the first solder pad 22 and the power supply input soldering dots 211. Thus, when the circuit substrate is fabricated, the distance between the projected area of the first solder pad 22 on the metal layer 21 and the power supply input soldering dots 211 may be controlled to be shorter than the distance threshold without considering the distance between the projected area of the first solder pad 22 on the metal layer 21 and the power supply output soldering dots 212.

In one embodiment, the first insulation layer 20 may be made of any insulation material, such as ceramic, FR-4 (fiber glass board), etc. The metal layer 21, the first solder pad 22, and the second solder pad 23 may be made of any metallic conductive material, such as copper, aluminum, etc.

In one embodiment, the projected area of the second solder pad 23 on the metal layer 21 is no smaller than an area threshold.

In one embodiment, the area threshold may be an area of a current output cross-section of the second solder pad 23. The area threshold may be configured according to actual requirements. For example, the area threshold may be 6.4 mm*5.575 mm≈35.68 mm$^2$ (projected area), 6.4 mm*24 μm≈0.1536 mm$^2$ (when a long side outputs a current, a cross-section area of the long side), or 5.575 mm*24 μm≈0.1338 mm$^2$ (when a short side outputs the current, the cross-section area of the short side), as long as the actual requirements are satisfied.

It can be seen from the above that after the current passes through the die, the current can flow from the power supply output soldering dots 212 to the second solder pad 23. Because the voltage at the second solder pad 23 is zero and the second solder pad 23 has an internal resistance itself, the voltage at the power supply output soldering dots 212 may not be zero. As such, the voltage at the power supply input soldering dots 211 may not reach the operating voltage. To reduce the voltage at the power supply output soldering dots 212, the equivalent resistance of the second solder pad 23 may be further reduced.

In one embodiment, the projected area (or the cross-section area for outputting the current) of the second solder pad 23 on the metal layer 21 may be increased to reduce the equivalent resistance of the second solder pad 23. That is, the area S in the equation R=ρL/S may be increased to reduce the equivalent resistance of the second solder pad 23. Thus, the voltages at the power supply output soldering dots 212 may be reduced and the power supply input soldering dots 211 may operate in the range of the normal operating voltage.

Figure 3:
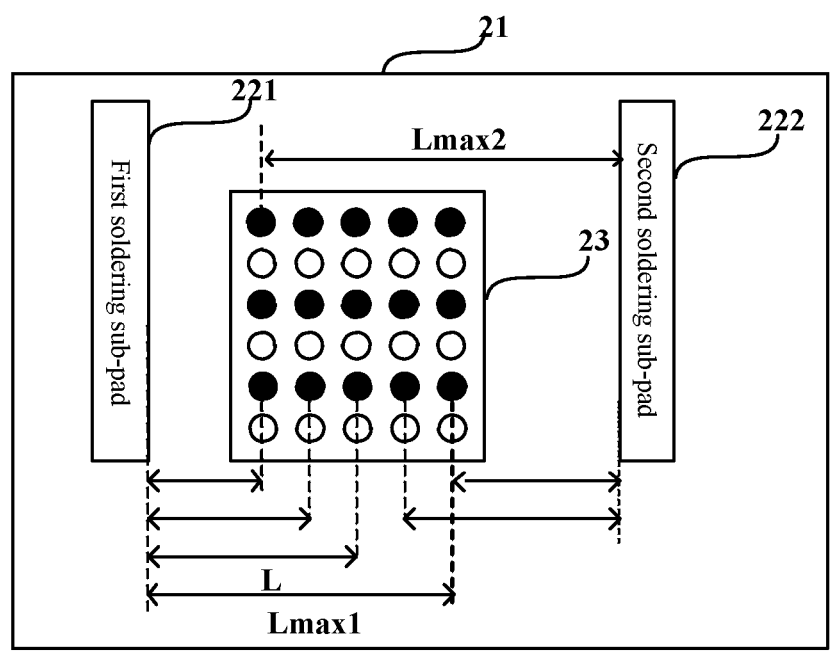
FIG. 3 illustrates a projected view of various components on a metal layer of an exemplary circuit substrate according to disclosed embodiments.

FIG. 3 illustrates a projected view of various components on a metal layer 21 of an exemplary circuit substrate according to the present disclosure. In one embodiment, as shown in FIG. 3, the circuit substrate includes the first solder pad 22. The first solder pad 22 includes a first soldering sub-pad 221 and a second soldering sub-pad 222. The first soldering sub-pad 221 and the second soldering sub-pad 222 are disposed on a first side and a second side of the second solder pad 23. The first side and the second side of the second solder pad 23 are opposite to each other.

The first side and the second side of the second solder pad 23 may be selected according to the actual requirements. For example, as shown in FIG. 3, the first side may be the left side, the right side, the top side, or the bottom side.

As shown in FIG. 3, a maximum vertical distance (a first distance) between the soldering dots on the metal layer 21 and the projected area of the first soldering sub-pad 221 on the metal layer 21 is $L_{max1}$. A maximum vertical distance (a second distance) between the soldering dots on the metal layer 21 and the projected area of the second soldering sub-pad 222 on the metal layer 21 is $L_{max2}$. The maximum value among the $L_{max1}$ and $L_{max2}$ may be the distance threshold. For example, assuming that $L_{max2}$ is greater than $L_{max1}$, then $L_{max2}$ is the distance threshold.

In one embodiment, the projected area of the first soldering sub-pad 221 on the metal layer 21 is a first projected area. The projected area of the second soldering sub-pad 222 on the metal layer 21 is a second projected area. A farthest distance between the soldering dots and the first projected area is a first farthest distance. A farthest distance between the soldering dots and the second projected area is a second farthest distance. The greater of the first farthest distance and the second farthest distance is the threshold distance.

In one embodiment, as shown in FIG. 3, one power supply input solder pad may be divided into two power supply input soldering sub-pads (the first soldering sub-pad 221 and the second soldering sub-pad 222 in FIG. 3) to supply power to the corresponding die from two sides of the power supply output solder pad (the second solder pad 23 in FIG. 3). As such, the distance between the power supply input solder pad and the power input soldering dots may be effectively reduced. For example, in many cases, the farthest distance would be $L_{max2}$ in FIG. 3. In the present disclosure, the farthest distance may be L ($L < L_{max2}$). As such, the voltage drop between the first solder pad 22 and the power supply input soldering dots 211 may further be reduced. Even the power supply input soldering dots 211 distant from the first solder pad 22 may also operate in the range of the normal operating voltage. The circuit substrate can thus operate normally.

In one embodiment, the shape of the projected area of each section of the circuit substrate may be configured arbitrarily, such as in a quadrilateral, a circle, a polygon, or an irregular shape, and is not limited by the present disclosure.

For illustrative purposes, the shapes of respective sections of the circuit substrate may be cuboids. The thickness (or height) of the respective sections of the circuit substrate is substantially small, such as 10 μm, 20 μm, 50 μm, etc. The length and width of the respective sections are substantially large, such as 1.0 cm and 1.5 cm, 2.0 cm and 1.0 cm, etc. Further, in one embodiment, a shape formed by the long sides (length, width) is called a surface and a shape formed by the short sides (height) is called a side surface.

Further, the first solder pad 22 may include the first soldering sub-pad 211, the second soldering sub-pad 222, and a third soldering sub-pad 223. The first soldering sub-pad 221 and the second soldering sub-pad 222 are disposed on the first side and the second side of the second solder pad 23, respectively. The third soldering sub-pad 223 is disposed on a third side or a fourth side of the second solder pad 23. The third side and the fourth side of the second solder pad 23 are opposite to each other.

In one embodiment, the projected area of the first soldering sub-pad 221 on the metal layer 21 is the first projected area. The projected area of the second soldering sub-pad 222 on the metal layer 21 is the second projected area. The projected area of the third soldering sub-pad 223 on the metal layer 21 is a third projected area. The farthest distance between the soldering dots and the first projected area is the first farthest distance. The farthest distance between the soldering dots and the second projected area is the second farthest distance. The farthest distance between the soldering dots and the third projected area is the third farthest distance. The greatest of the first farthest distance, the second farthest distance, and the third farthest distance is the threshold distance.

Figure 4:
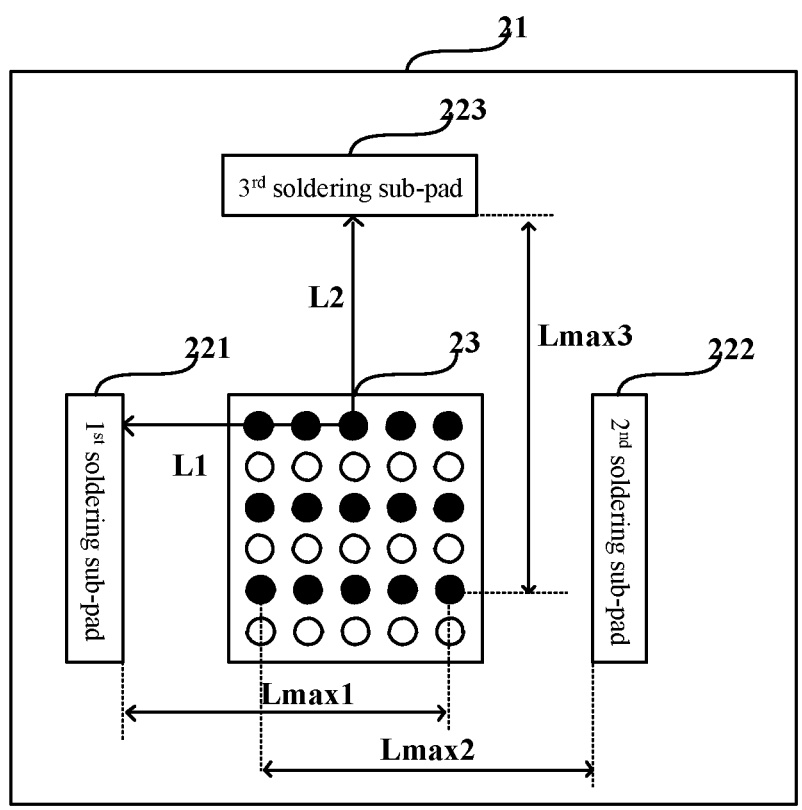
FIG. 4 illustrates a projected view of various components on a metal layer of another exemplary circuit substrate according to disclosed embodiments.

FIG. 4 illustrates a projected view of various components on a metal layer of another exemplary circuit substrate according to the present disclosure. As shown in FIG. 4, in the circuit substrate, the third soldering sub-pad 223 is disposed on the third side of the second solder pad 23.

As shown in FIG. 4, the maximum vertical distance (the first distance) between the soldering dots on the metal layer 21 and the projected area of the first soldering sub-pad 221 on the metal layer 21 is $L_{max1}$. The maximum vertical distance (the second distance) between the soldering dots on the metal layer 21 and the projected area of the second soldering sub-pad 222 on the metal layer 21 is $L_{max2}$. A maximum vertical distance (a third distance) between the soldering dots on the metal layer 21 and the projected area of the third soldering sub-pad 223 on the metal layer 21 is $L_{max3}$. The maximum value among the $L_{max1}$, $L_{max2}$, and $L_{max3}$ is the distance threshold. For example, assuming that $L_{max3}$ may be greater than $L_{max1}$ and $L_{max2}$, then $L_{max3}$ would be the distance threshold.

As shown in FIG. 4, after the third soldering sub-pad 223 is configured, some soldering dots on the metal layer 21 are located closer to the side edge of the projected area of the first solder pad 22 on the metal layer 21. For example, the distance between a certain power supply input soldering dot 211 and the first solder pad 22 is reduced from L1 to L2 (L2<L1). As such, the equivalent resistance between the soldering dot and the first solder pad 22 may be further reduced. The voltage drop between the soldering dot and the first solder pad 22 may be reduced. The voltage at the soldering dot may be substantially consistent with the voltages at other soldering dots. Thus, the voltages at the soldering dots may be balanced and the soldering dots may operate in the range of the normal operating voltage.

Figure 5:
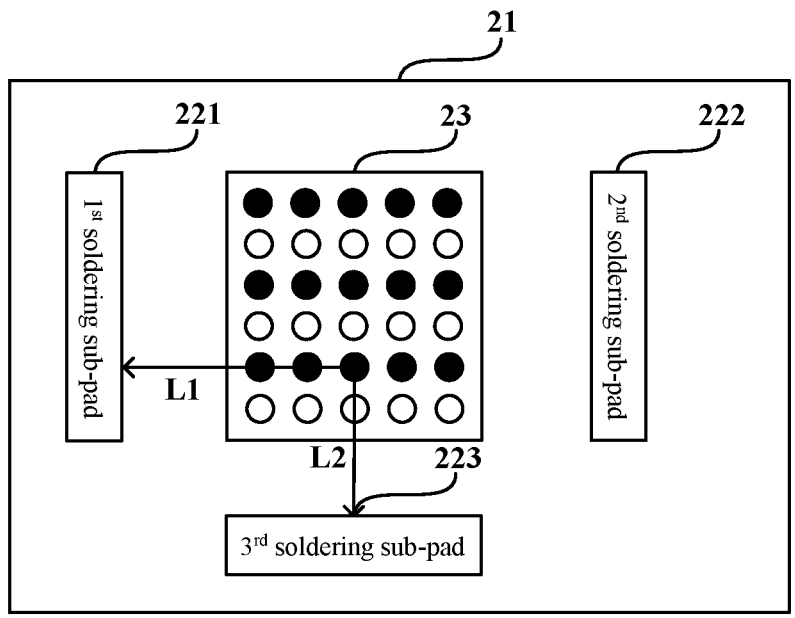
FIG. 5 illustrates a projected view of various components on a metal layer of another exemplary circuit substrate according to disclosed embodiments.

Similarly, FIG. 5 illustrates a projected view of various components on a metal layer of another exemplary circuit substrate according to the present disclosure. As shown in FIG. 5, in the circuit substrate, the third soldering sub-pad 223 is disposed on the fourth side of the second solder pad 23. In this case, the circuit substrate operates in the same way as previously described. For example, the distance between a certain power supply input soldering dot 211 and the first solder pad 22 is reduced from L1 to L2 (L2<L1).

Figure 6:
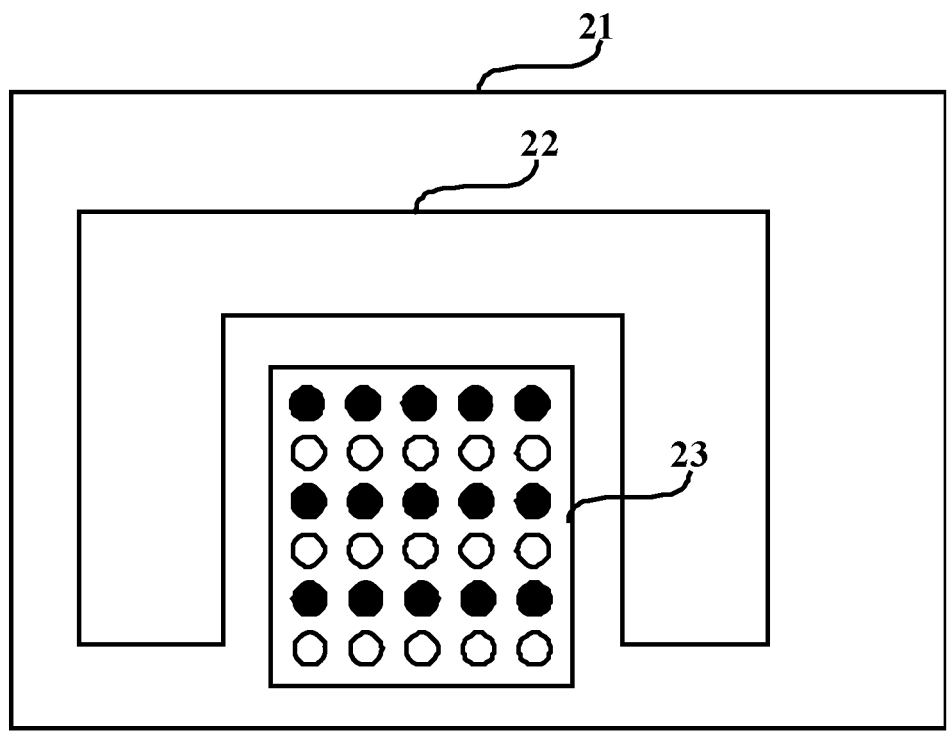
FIG. 6 illustrates a projected view of various components on a metal layer of another exemplary circuit substrate according to disclosed embodiments.
Figure 7:
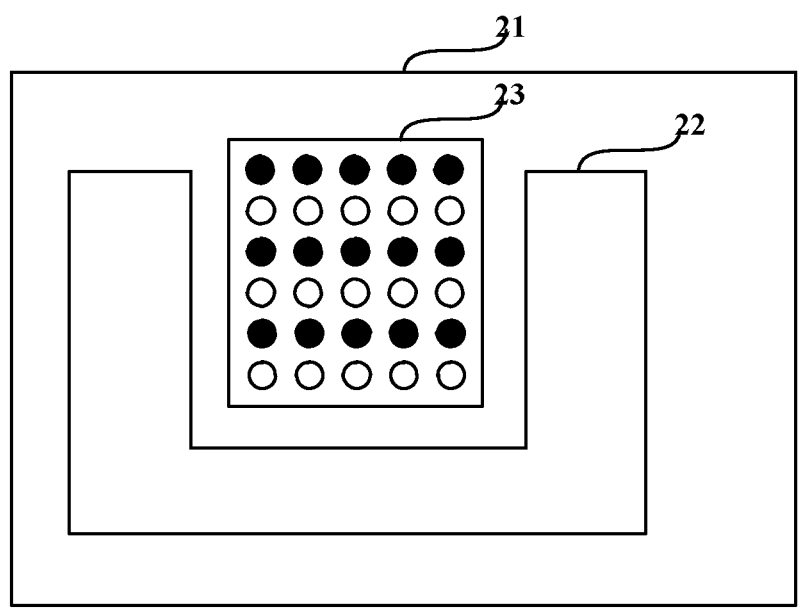
FIG. 7 illustrates a projected view of various components on a metal layer of another exemplary circuit substrate according to disclosed embodiments.

In one embodiment, in addition to being separately disposed, the soldering sub-pads of the first solder pad 22 may be disposed as a whole on respective sides of the second solder pad 23 as shown in FIG. 6 and FIG. 7. FIG. 6 illustrates a projected view of various components on a metal layer of another exemplary circuit substrate according to the present disclosure. FIG. 7 illustrates a projected view of various components on a metal layer of another exemplary circuit substrate according to present disclosure.

The circuit substrates in FIG. 6 and FIG. 7 may achieve the same technical effects as the circuit substrates in FIG. 4 and FIG. 5 and will not be described again in detail herein.

As shown in FIG. 6 and FIG. 7, the first solder pad 22 is disposed on at least two outer sides of the second solder pad 23. The projected area of the first solder pad 22 on the metal layer 21 is of a concave shape. The projected area of the second solder pad 23 on the metal layer 21 is of a convex shape. The concave portion of the concave shape encloses the convex portion of the convex shape.

Further, in one embodiment, the projected area of the first solder pad 22 on the metal layer 21 may include at least two concave shaped surfaces. The projected area of the second solder pad 23 on the metal layer 21 may include at least two convex shaped surfaces. The at least two concave shaped surfaces are one-to-one corresponding to the at least two convex shaped surfaces. The concave portion of the concave shaped surface encloses the convex portion of the corresponding convex shaped surface.

Figure 8A:
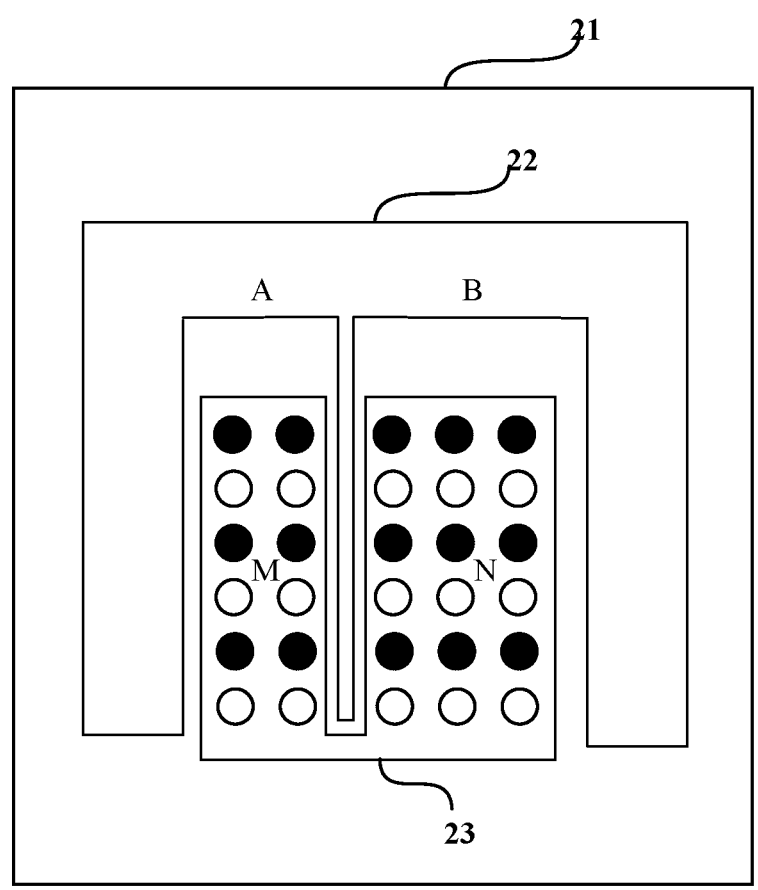
FIG. 8A illustrates a projected view of various components on a metal layer of another exemplary circuit substrate according to disclosed embodiments.
Figure 8B:
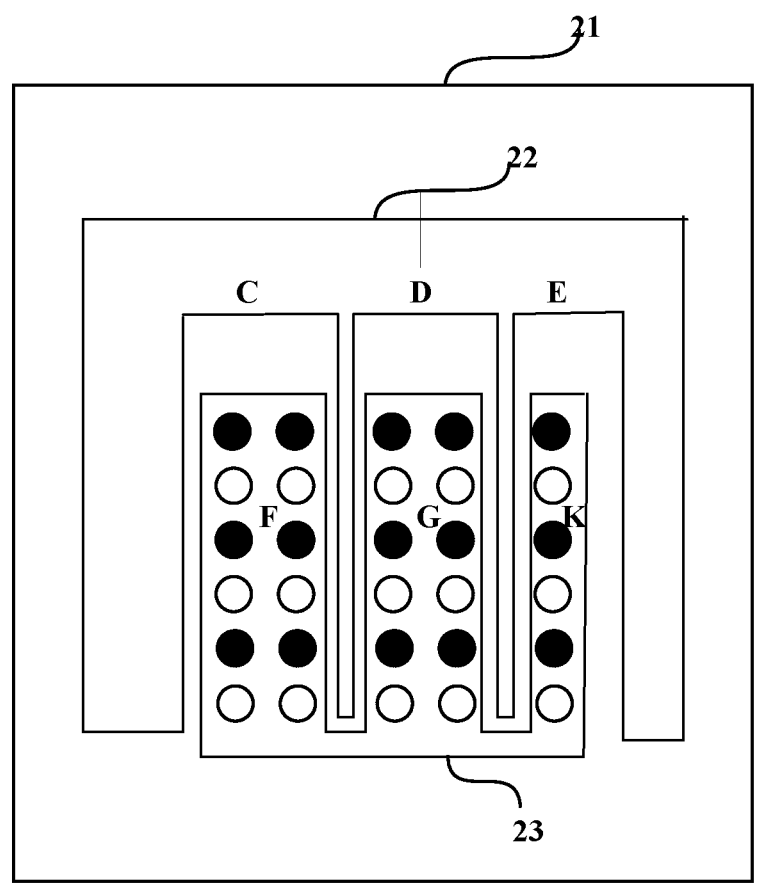
FIG. 8B illustrates a projected view of various components on a metal layer of another exemplary circuit substrate according to disclosed embodiments.

FIG. 8A illustrates a projected view of various components on a metal layer of another exemplary circuit substrate according to the present disclosure. FIG. 8B illustrates a projected view of various components on a metal layer of another exemplary circuit substrate according to the present disclosure.

As shown in FIG. 8A, the projected area of the first solder pad 22 on the metal layer 21 includes two concave shaped surfaces, referred to as a concave shaped surface A and a concave shaped surface B. The projected area of the second solder pad 23 on the metal layer 21 includes two convex shaped surfaces, referred to as a convex shaped surface M and a convex shaped surface N. The concave portion of the concave shaped surface A encloses the convex portion of the convex shaped surface M. The concave portion of the concave surface B encloses the convex portion of the convex surface N.

As shown in FIG. 8B, the projected area of the first solder pad 22 on the metal layer 21 includes three concave surfaces, referred to as a concave shaped surface C, a concave shaped surface D, and a concave shaped surface E. The projected area of the second solder pad 23 on the metal layer 21 includes three convex shaped surfaces, referred to as a convex shaped surface F, a convex shaped surface G, and a convex shaped surface K. The concave portion of the concave shaped surface C encloses the convex portion of the convex shaped surface F. The concave portion of the concave shaped surface D encloses the convex portion of the convex shaped surface G. The concave portion of the concave shaped surface E encloses the convex portion of the convex shaped surface K.

The concave shaped surfaces of the first solder pad 22 in the projected area on the metal layer 21 may face other directions. For example, the concave shaped surface may face toward the upper side, the left side, or the right side, etc. Correspondingly, orientation of the convex shaped surfaces of the second solder pad 23 in the projected area on the metal layer 21 may be adjusted, such that the orientation of the concave shaped surfaces would match the orientation of the convex shaped surfaces.

Figure 9A:
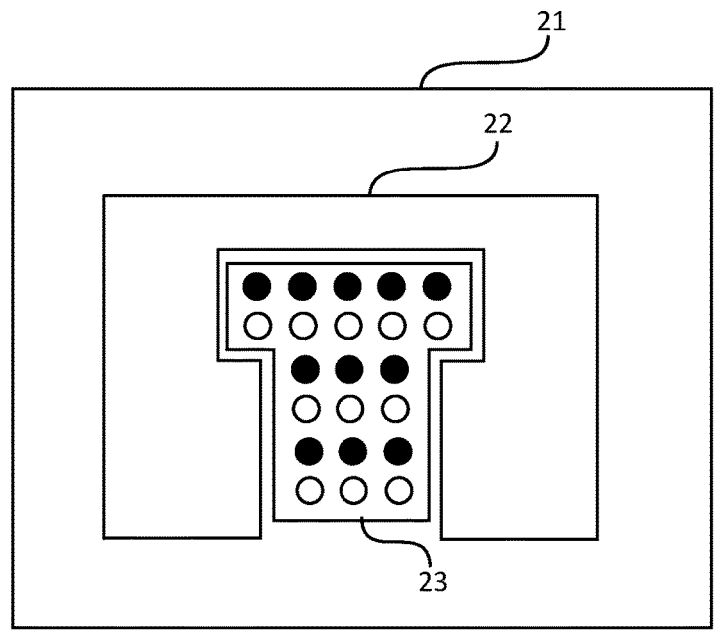
FIG. 9A illustrates a projected view of various components on a metal layer of another exemplary circuit substrate according to disclosed embodiments.

In some other embodiments, projected areas of the first solder pad 22 and the second solder pad 23 on the metal layer 21 may have other shapes. FIG. 9A illustrates a projected view of various components on a metal layer of another exemplary circuit substrate according to the present disclosure. For example, the projection area of the second solder pad 23 may be a T-shaped surface, as shown in FIG. 9A, as long as the soldering dots on the metal layer 21 are substantially close to the side edge of the projected area of the first solder pad 22 on the metal layer 21 (i.e., the distance between the soldering dots on the metal layer 21 and the projected area of the first solder pad 22 on the metal layer is less than a threshold, such as a farthest distance from the soldering dots to the projected area of the first solder pad 22 on the metal layer 21).

Figure 9B:
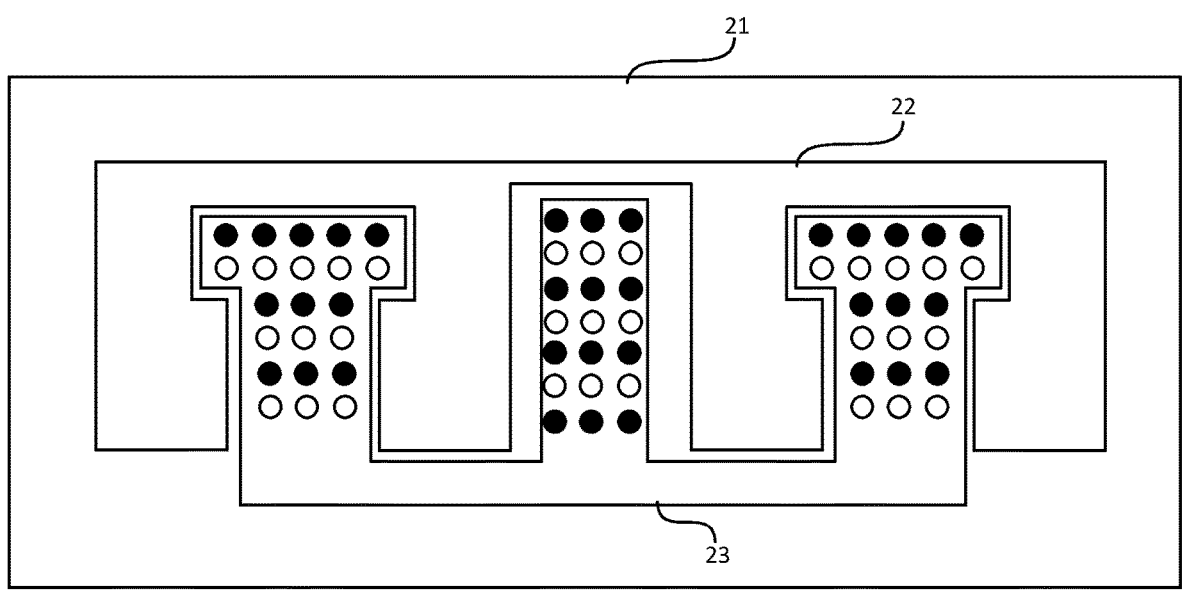
FIG. 9B illustrates a projected view of various components on a metal layer of another exemplary circuit substrate according to disclosed embodiments.

FIG. 9B illustrates a projected view of various components on a metal layer of another exemplary circuit substrate according to the present disclosure. In some other embodiments, as shown in FIG. 9B, the projected areas of the first solder pad 22 and the second solder pad 23 on the metal layer 21 may also include a combination of the previously described shapes.

The projected areas of the first solder pad 22 and the second solder pad 23 on the metal layer 21 may have any shape that reduce the distances between the soldering dots on the metal layer 21 and the side edge of the projected area of the first solder pad 22 on the metal layer 21, such as a circle shape, a fan shape, or a polygon shape, etc.

Figure 10:
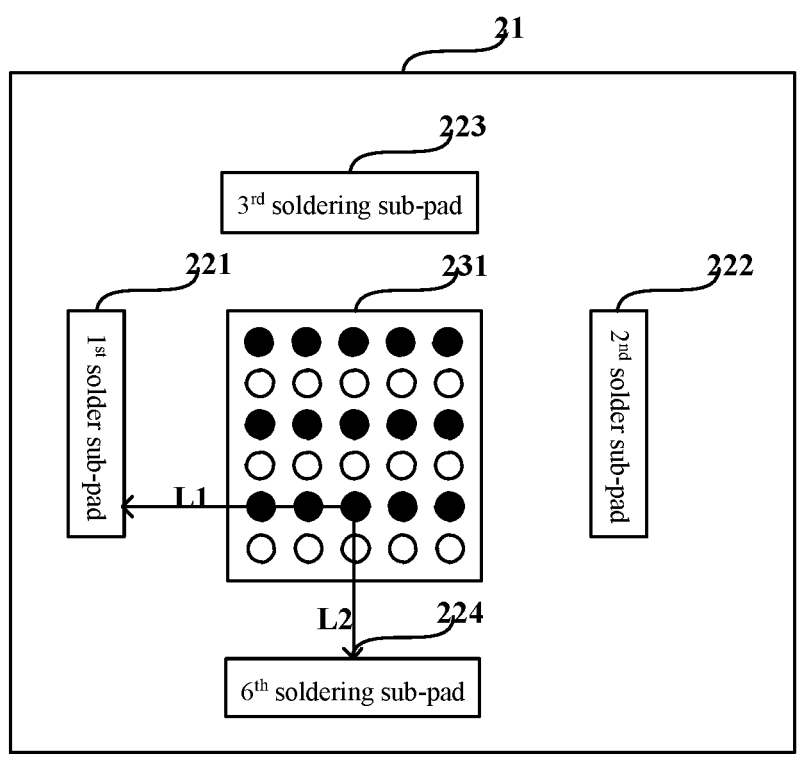
FIG. 10 illustrates a projected view of various components on a metal layer of another exemplary circuit substrate according to disclosed embodiments.

FIG. 10 illustrates a projected view of various components on a metal layer of another exemplary circuit substrate according to the present disclosure. As shown in FIG. 10, the first solder pad 22 may include a fourth soldering sub-pad 224. The fourth soldering sub-pad 224 may be disposed on the fourth side of the second solder pad 23, opposite to the third side.

As shown in FIG. 10, after the fourth soldering sub-pad 224 is configured, some soldering dots on the metal layer 21 are located closer to the side edge of the projected area of the first solder pad 22 on the metal layer 21. For example, the distance between a certain power supply input soldering dot 211 and the first solder pad 22 is reduced from L1 to L2 (L2<L1). As such, the equivalent resistance between the soldering dot and the first solder pad 22 may be further reduced. The voltage drop between the soldering dot and the first solder pad 22 may be reduced. The voltage at the soldering dot may be substantially consistent with the voltages at other soldering dots. Thus, the voltages at the soldering dots may be balanced and the soldering dots may operate in the range of the normal operating voltage.

Figure 11:
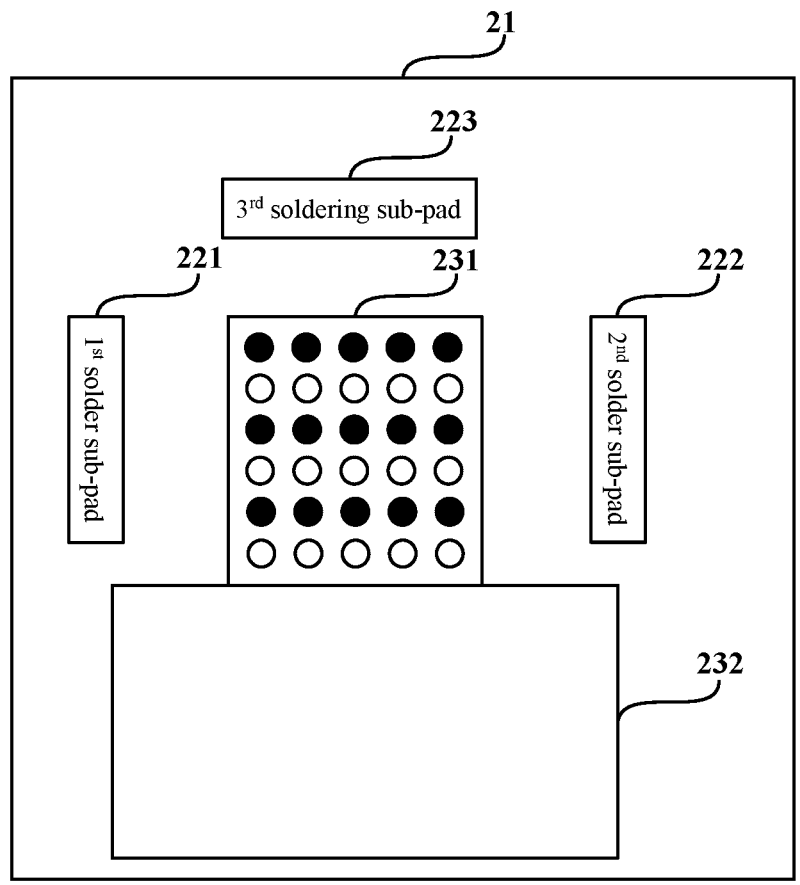
FIG. 11 illustrates a projected view of various components on a metal layer of another exemplary circuit substrate according to disclosed embodiments.

Further, the projected area of the second solder pad 23 on the metal layer 21 may be increased. FIG. 11 illustrates a projected view of various components on a metal layer of another exemplary circuit substrate according to the present disclosure. As shown in FIG. 11, the second solder pad 23 may also include a fifth soldering sub-pad 231 and a sixth soldering sub-pad 232. The sixth soldering sub-pad 232 may be disposed on the fourth side of the second solder pad 23, opposite to the third side. Soldering dots may be disposed in the projected area of the fifth soldering sub-pad 231 on the metal layer 21 to one-to-one correspond to the soldering dots on the corresponding die. The sixth soldering sub-pad 232 is connected to the fifth soldering sub-pad 231. The area occupied by the second solder pad 23 increases substantially to reduce the equivalent resistance of the second solder pad 23. Thus, the voltage drop between the power supply output soldering dots 212 and the second solder pad 23 may be reduced and the voltages at the power supply output soldering dots are balanced.

The fifth soldering sub-pad 231 and the sixth soldering sub-pad 232 may be one pad or a plurality of connected pads.

In some embodiments, the soldering sub-pads may be integrated into one pad or disposed individually.

Figure 12:
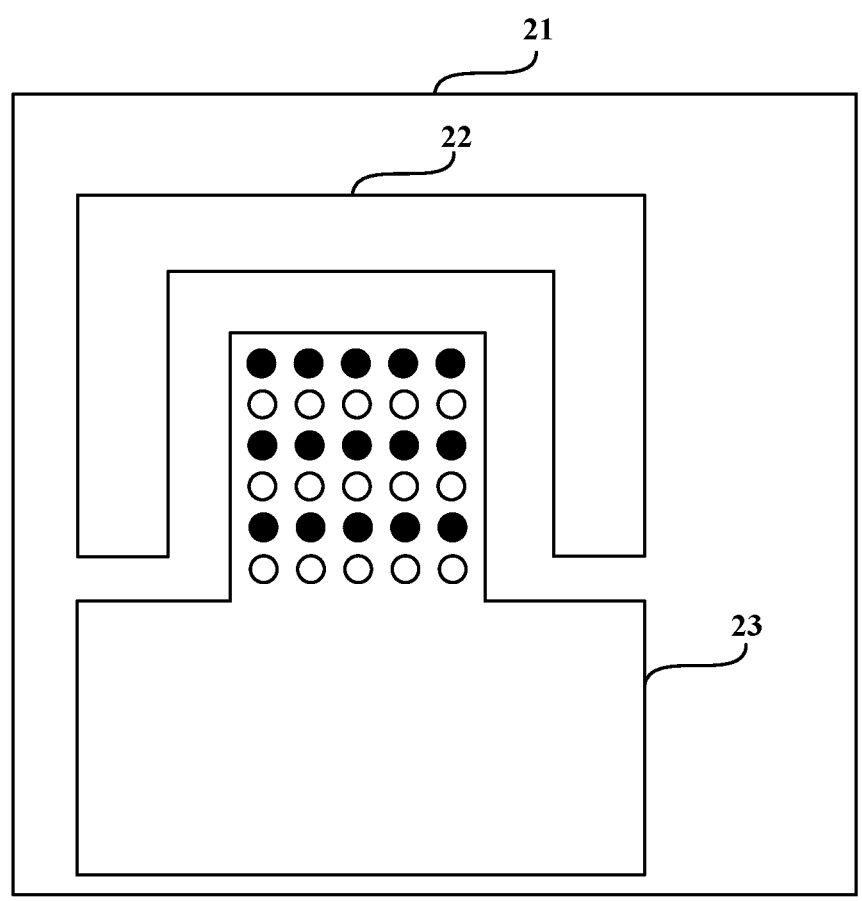
FIG. 12 illustrates a projected view of various components on a metal layer of another exemplary circuit substrate according to disclosed embodiments.

FIG. 12 illustrates a projected view of various components on a metal layer of another exemplary circuit substrate according to the present disclosure. As shown in FIG. 12, in the circuit substrate, the projected area of the first solder pad 22 on the metal layer 21 is a concave shaped surface. The projected area of the second solder pad 23 on the metal layer 21 is a convex shaped surface. The concave portion of the concave shaped surface encloses the convex portion of the convex surface. The circuit substrate may achieve the same technical effect as previously described.

Figure 13:
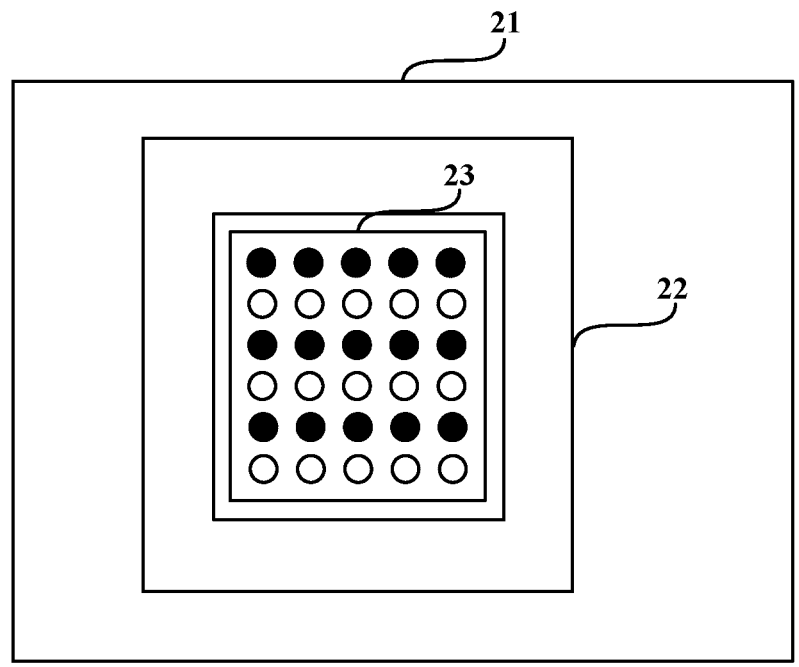
FIG. 13 illustrates a projected view of various components on a metal layer of another exemplary circuit substrate according to disclosed embodiments.

FIG. 13 illustrates a projected view of various components on a metal layer of another exemplary circuit substrate according to the present disclosure. As shown in FIG. 13, when the first solder pad is disposed on at least two outer sides of the second solder pad 23, the projected area of the first solder pad 22 on the metal layer 21 may enclose the projected area of the second solder pad 23 on the metal layer 21.

As shown in FIG. 13, the distance between the first solder pad 22 and the power supply input soldering dots 211 are substantially short. The first solder pad 22 may supply power to the die from four sides of the die. Thus, the voltage drop between the first solder pad 22 and the power supply input soldering dots 211 may be further reduced and the soldering dots may operate in the range of the normal operating voltage.

In one embodiment, because the first solder pad 22, the solder pad 23, and the metal layer 21 are all made of metallic conductive materials, such as copper, aluminum, etc., the equivalent resistance of the first solder pad 22, the second solder pad 23, and the metal layer 21 are often substantially small. Under the circumstances that high precision is not required, this equivalent resistance thereof may often be negligible.

Figure 14:
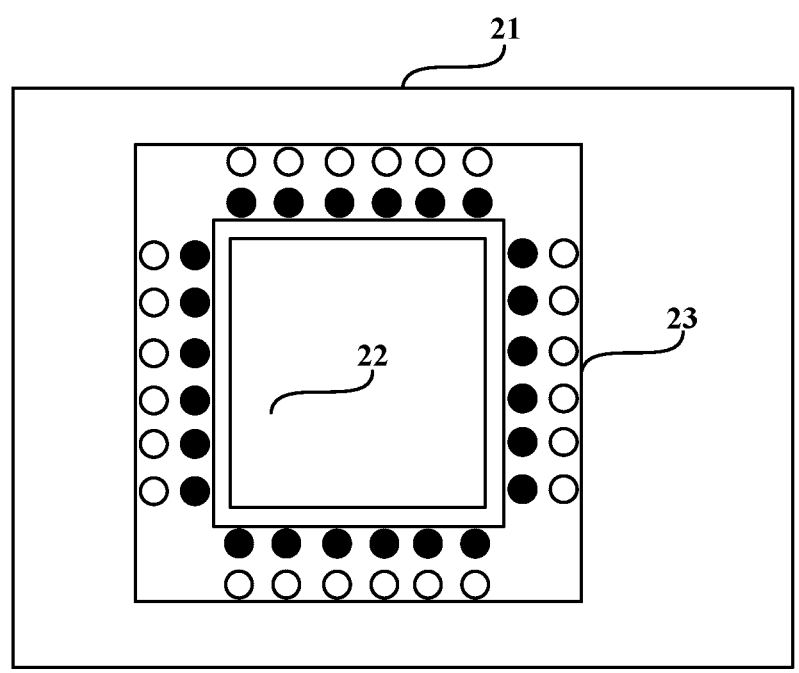
FIG. 14 illustrates a projected view of various components on a metal layer of another exemplary circuit substrate according to disclosed embodiments.

FIG. 14 illustrates a projected view of various components on a metal layer of another exemplary circuit substrate according to the present disclosure. As shown in FIG. 14, when the first solder pad is disposed on at least two inner sides of the second solder pad 23, the projected area of the second solder pad 23 on the metal layer 21 encloses the projected area of the first solder pad 22 on the metal layer 21.

In one embodiment, the second solder pad 23 may be disposed in a ring shape. For example, the second solder pad 23 may be a ring, a square ring, etc. Correspondingly, the first solder pad 22 may also be disposed in the inner side of the ring of the second solder pad 23. For example, as shown in FIG. 14, the distance between the first solder pad 22 and the power supply input soldering dots 211 is substantially short. The first solder pad 22 may supply power to the die from the four sides of the die. Thus, the voltage drop between the first solder pad 22 and the power supply input soldering dots 211 may be further reduced and the soldering dots may be ensured to operate in the range of the normal operating voltage.

In one embodiment, because the first solder pad 22 and the second solder pad 23 enclose each other, in the actual fabrication process, additional metal layer 21 and first insulation layer 20 may be added to achieve the current transmission.

In one embodiment, corresponding signal input/output solder pad (not shown) may be disposed on the circuit substrate to achieve corresponding signal transmission. The signal input/output solder pad may be disposed in any layer of the circuit substrate as long as the actual requirements are satisfied.

In one embodiment, to reduce the distance between the first solder pad 22 and the soldering dots on the metal layer 21, relative position between the first solder pad 22 and the metal layer 21 may be modified. For example, a portion of or the entire projected area of the first solder pad 22 on the metal layer 21 may be disposed in an area disposed with soldering dots. Correspondingly, the entire structure of the circuit substrate may be adjusted. In some embodiments, the thickness of the entire circuit substrate may be controlled not to exceed a thickness threshold, such as 1 mm, 900 µm, etc.

Figure 15:
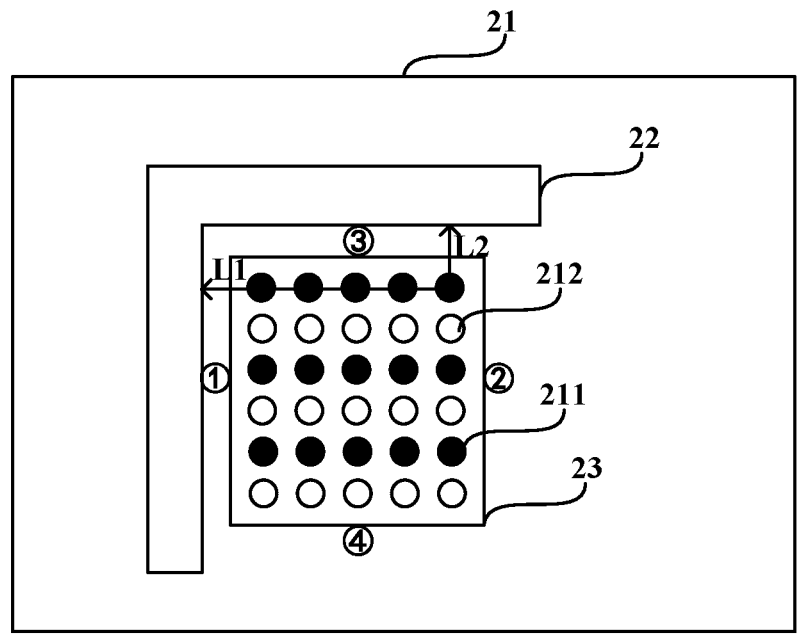
FIG. 15 illustrates a projected view of various components on a metal layer of another exemplary circuit substrate according to disclosed embodiments.

FIG. 15 illustrates a projected view of various components on a metal layer of another exemplary circuit substrate according to the present disclosure. As shown in FIG. 15, the circuit substrate may include the first insulation layer 20 (not shown), the metal layer 21, the first solder pad 22, and the second solder pad 23. The metal layer 21 is disposed on the first surface of the first insulation layer 20. The second solder pad 23 (referring to FIG. 16) is disposed on the second surface of the first insulation layer 20 opposite the metal layer 21. At least two soldering dots (the power supply input soldering dots 211 and the power supply output soldering dots 212 in FIG. 15) may be disposed in the projected area of the second solder pad 23 on the metal layer 21 to one-to-one correspond to the soldering dots on the die. The first solder pad 22 may be disposed on at least one surface or at least two sides of the second solder pad 23, for example, on a top surface (not shown), a bottom surface (not shown), a first side ((1) side), and a third side ((3) side).

Figure 16:
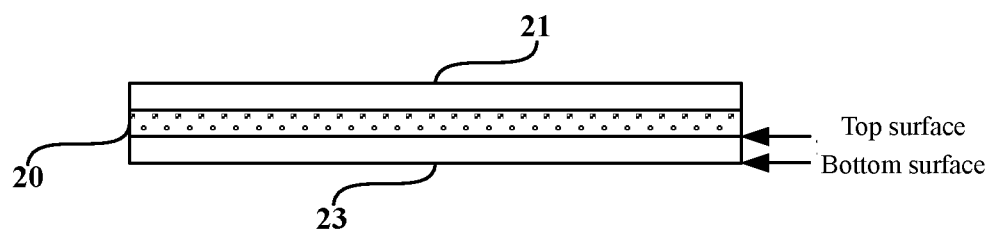
FIG. 16 illustrates a cross-sectional view of another exemplary circuit substrate according to disclosed embodiments.

FIG. 16 illustrates a cross-sectional view of another exemplary circuit substrate according to the present disclosure. The cross-sectional view may be any cross-sectional view that can clearly represent relative positions between various components on the circuit substrate and is not limited by the present disclosure.

In one embodiment, as shown in FIG. 16, surfaces of the second solder pad 23 refer to two planes in parallel with an extension direction of the metal layer 21 and the first insulation layer 20, including a top surface and a bottom surface. The side surfaces of the second solder pad 23 may be the four surfaces perpendicular to the extension direction of the metal layer 21 and the first insulation layer 20, including (1) side, (2) side, (3) side, and (4) side as shown in FIG. 15.

In one embodiment, sections of the circuit substrate may extend in a same direction, such as being consistent (parallel) with the paper surface direction of the present specification.

In one embodiment, when the first solder pad 22 is disposed opposing at least one surface of the second solder pad 23, the voltages at the soldering dots on the metal layer 21 may be kept consistent. When the first solder pad 22 is disposed opposing at least two sides of the second solder pad 23, the differences between the voltages at the soldering dots on the metal layer 21 may be substantially small. Thus, the problem that the voltages at the soldering dots on the metal layer 21 are not balanced may be resolved and the normal operation of the circuit substrate may be ensured.

Figure 17:
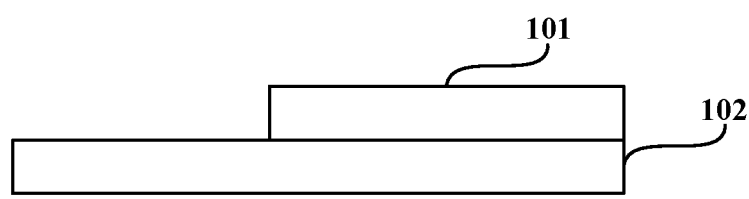
FIG. 17 illustrates a cross-sectional view of an exemplary chip according to disclosed embodiments.

Correspondingly, the present disclosure also provides a chip. FIG. 17 illustrates a cross-sectional view of an exemplary chip according to the present disclosure. As shown in FIG. 17, the chip may include a die 101 and a circuit substrate 102. The die 101 is disposed on the surface of the metal layer 21 opposite the first insulation layer 20. The soldering dots on the metal layer 21 may one-to-one connect to the soldering dots on the die 101.

In one embodiment, one or more dies 101 may be disposed on the circuit substrate 102. The present disclosure does not pose any limitations on the configurations of the dies.

In one embodiment, connections between the soldering dots on the die 101 and the soldering dots on the metal layer may include one-to-one connections, including physical connections, electrical connections, between input soldering dots on the die 101 and power supply input soldering dots 211 on the metal layer 21 and one-to-one connections (e.g., physical connections, electrical connections) between output soldering dots on the die 101 and the power supply output soldering dots 212 on the metal layer 21.

In the chip provided by the embodiments of the present disclosure, a power supply input solder pad 22 and a power supply output solder pad 23 may often be a power supply input interface and a power supply output interface, respectively.

It should be noted that the chip may also include corresponding encapsulation material.

Further, the present disclosure also provides a series circuit. The series circuit may include at least two chip sets that are connected in parallel. Each chip set may include at least two chips provided by the embodiment of the present disclosure, which are connected in turn in series.

Further, the present disclosure also provides a circuit board. The circuit board may include the series circuit provided by the embodiments of the present disclosure.

The circuit board may often be a computing board, an algorithm board, or a calculating board, etc. in an electronic device.

Further, the present disclosure also provides an electronic device. The electronic device may include at least one circuit board provided by the embodiments of the present disclosure. When there are two or more circuit boards, the circuit boards may be connected in parallel with each other.

Figure 18:
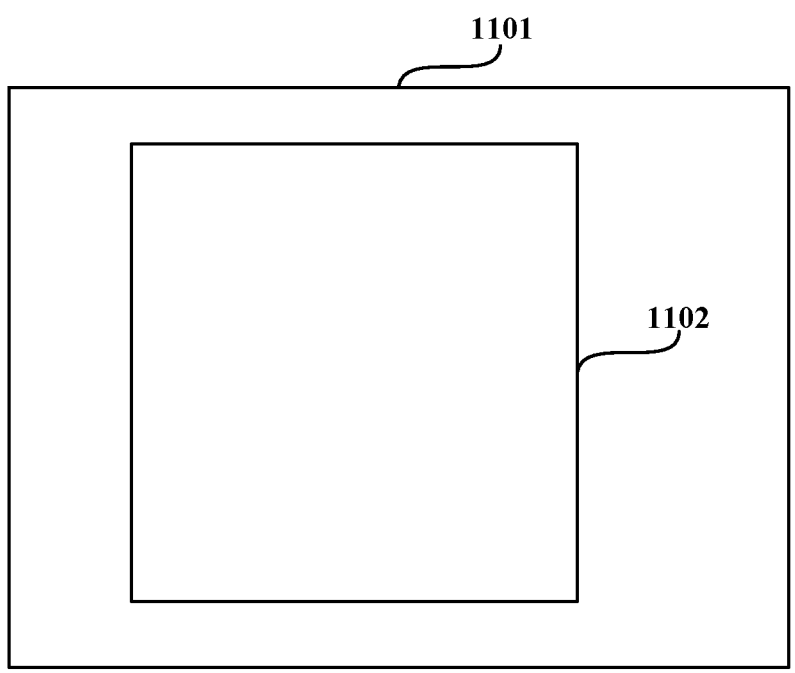
FIG. 18 illustrates a cross-sectional view of an exemplary electronic device according to disclosed embodiments.

FIG. 18 illustrates a cross-sectional view of an exemplary electronic device according to the present disclosure. As shown in FIG. 18, the electronic device may include a body 1101 and a chip 1102 provided by the embodiments of the present disclosure.

The electronic device may often be a terminal device, a personal computer, or a cryptocurrency mining machine or device, etc.

In one embodiment, when a high computing power of the electronic device is required, for example, when the electronic device is the cryptocurrency mining device, the number of the chips 1102 in the electronic device may be numerous, such as 60, 100, or 200, etc. In this case, a plurality of chips are divided into a plurality of chip sets that are connected in parallel with each other. Each chip set may include a plurality of chips that are connected in series with each other. An output voltage of a preceding chip is an input voltage of a succeeding chip. In this case, power supply output interfaces of the advanced chips may output non-zero voltages. Only the power supply output interface of the very last chip may output a zero voltage.

It should be noted that all terms such as "first", "second", "third", "fourth", "fifth", and "sixth" are intended to distinguish different subjects, and do not limit the present disclosure.

The present disclosure describes a circuit substrate, a chip, and an electronic device. The circuit substrate includes an insulation layer, a metal layer, a first solder pad, and a second solder pad. The metal layer is disposed on a first surface of the insulation layer. The first solder pad and the second solder pad are disposed on a second surface of the insulation layer opposite the surface the metal layer is disposed on. The shortest distance between soldering dots on the metal layer and a side edge of a projected area of the first solder pad on the metal layer is no greater than a distance threshold. The soldering dots on the metal layer are one-to-one corresponding to soldering dots on the die. Compared to the existing technology, in the embodiments of the present disclosure, the distance between the soldering dots on the metal layer and the side edge of the projected area of the first solder pad on the metal layer is substantially short, and the corresponding equivalent resistance is substantially small. Thus, the voltages at the soldering dots on the metal layer are balanced with each and the normal operation of the circuit substrate is ensured.

Those skilled in the art will appreciate that the embodiments of the present disclosure can be provided as a method, an apparatus (device), or a computer program product. Accordingly, the present disclosure may take the form of an entirely hardware embodiment, an entirely software embodiment, or a combination of software and hardware. Moreover, the present disclosure may take the form of the computer program product embodied on one or more computer-readable storage medium containing computer program instructions. The computer-readable storage medium includes, but is not limited to, a magnetic disk, a CD-ROM, or an optical disk, etc.

The present disclosure has been described with reference to flow charts and block diagrams of the method, the apparatus, and the computer program product provided by the embodiments of the present disclosure. When being executed by a processor, the computer program instructions implement each step of the flow chart or each function of the block diagram or a combination of both. The processor may be a general-purpose computer, a special-purpose computer, an embedded processor, or a processor of other programmable data processing device.

The computer program instructions may be stored in a computer-readable memory to instruct the computer or other programmable data processing device to operate in certain way, such that the instructions stored in the computer-readable memory produce an article of manufacture comprising the instruction device. The apparatus implements the functions specified in one or more blocks of the block diagram and/or in one or more steps of the flow chart.

While the embodiments of the present disclosure have been described, those skilled in the art may change or modify the embodiments once the basic creative concepts are known. Therefore, the appended claims are intended to be interpreted as including the embodiments and all the changes and modifications in the scope of the present disclosure.

It should be understood by those skilled in the art that the foregoing are merely certain preferred embodiments of the present invention and are not intended to limit the present invention. Without departing from the spirit and principles of the present invention, any modifications, equivalent substitutions, and improvements, etc. shall fall within the scope of the present invention.

What is claimed is:

1. A circuit substrate, comprising:
an insulation layer;
a metal layer disposed on a first surface of the insulation layer; and
a first solder pad and a second solder pad disposed on a second surface of the insulation layer opposite the metal layer disposed on the first surface of the insulation layer,
wherein a soldering dot is positioned on an outer surface of the metal layer further away from the first surface of the insulation layer,
wherein a vertical projection of the soldering dot taken along a thickness direction of the circuit substrate touches the second solder pad,
wherein the vertical projection of the soldering dot taken along the thickness direction of the circuit substrate also touches the first solder pad,
wherein the first solder pad is connected to the metal layer through a first through-hole, the second solder pad is connected to the metal layer through a second through-hole, the second through-hole is shorter in length than the first through-hole and is spaced apart from the first through-hole, and
wherein a first projected area of the first solder pad taken along the thickness direction includes a concave surface to receive a convex surface of a second projected area of the second solder pad taken along the thickness direction.

2. The circuit substrate according to claim 1, wherein:
the first solder pad is a power supply input solder pad; and
the second solder pad is a power supply output solder pad.

3. The circuit substrate according to claim 1, wherein:
the first solder pad includes a first soldering sub-pad, a second soldering sub-pad, and a third soldering sub-pad;
the first soldering sub-pad and the second soldering sub-pad are disposed on a first side and a second side of the second solder pad, respectively; and
the third soldering sub-pad is disposed on a third side of the second solder pad, the third side being at an angle relative to the first side or the second side.

4. The circuit substrate according to claim 3, wherein:
the first solder pad further includes a fourth soldering sub-pad;
the fourth soldering sub-pad is disposed on a fourth side of the second solder pad; and
the third side and the fourth side of the second solder pad are opposite to each other.

5. The circuit substrate according to claim 1, wherein the first projected area of the first solder pad on the metal layer encloses the second projected area of the second solder pad on the metal layer, both the first and the second projected areas are taken along the thickness direction of the circuit substrate.

6. The circuit substrate according to claim 1, wherein the insulation layer is a first insulation layer, and the circuit substrate further comprises:
a second insulation layer disposed between the first solder pad and the second solder pad.

7. The circuit substrate according to claim 6, further comprising:
a through-hole positioned through the first insulation layer, the first solder pad, and the second insulation layer, to transport current between the soldering dot and the second solder pad.

8. The circuit substrate according to claim 6, wherein the first through-hole passes through the first insulation layer, and the second through-hole passes through both the first and the second insulation layers.

9. The circuit substrate according to claim 1, wherein the first solder pad includes a first solder sub-pad and a second solder sub-pad separate from the first solder sub-pad, the first solder sub-pad is positioned at a first side of the second solder pad, the second solder sub-pad is positioned at a second side of the second solder pad, and the second side of the second solder pad is at an angle relative to the first side of the second solder pad.

10. The circuit substrate according to claim 1, wherein the soldering dot is an input soldering dot, the circuit substrate further comprises an output soldering dot positioned on the outer surface of the metal layer, the first solder pad is connected to the input soldering dot through the first through-hole, and the second solder pad is connected to the output soldering dot through the second through-hole.

11. The circuit substrate according to claim 1,
wherein the soldering dot is a power supply input dot, and the circuit substrate further includes a power supply output dot; and
wherein a current flows through the first solder pad, the first through-hole, the metal layer, the power supply input soldering dot, and wherein the current then flows through the power supply output dot, the second through-hole, and the second solder pad to a ground.

12. The circuit substrate according to claim 1, wherein the first solder pad includes a first soldering sub-pad and a second soldering sub-pad, and the second solder pad is positioned between the first soldering sub-pad and the second soldering sub-pad.

13. The circuit substrate according to claim 1, wherein the concave surface of the first projected area includes a first concave surface and a second concave surface, the convex surface of the second projected area includes a first convex surface and a second convex surface, the first concave surface being to receive the first convex surface of the second projected area of the second solder pad and the second concave surface being to receive the second convex surface of the second projected area of the second solder pad.

14. The circuit substrate according to claim 1, wherein the soldering dot is a first soldering dot, the circuit substrate further comprises a second soldering dot positioned spaced apart from the first soldering dot and positioned on a same outer surface of the metal layer.

15. A chip, comprising: a die; and a circuit substrate, wherein the circuit substrate comprises:
an insulation layer;
a metal layer disposed on a first surface of the insulation layer; and
a first solder pad and a second solder pad disposed on a second surface of the insulation layer opposite the metal layer,
wherein a soldering dot is positioned on an outer surface of the metal layer further away from the first surface of the insulation layer,
wherein a vertical projection of the soldering dot taken along a thickness direction of the circuit substrate touches the second solder pad,
wherein the vertical projection of the soldering dot taken along the thickness direction of the circuit substrate also touches the first solder pad,
wherein the first solder pad is connected to the metal layer through a first through-hole, the second solder pad is connected to the metal layer through a second through-hole, the second through-hole is shorter in length than the first through-hole and is spaced apart from the first through-hole, and
wherein a first projected area of the first solder pad includes a concave surface to receive a convex surface of a second projected area of the second solder pad.

16. An electronic device, comprising a circuit board including a chip, a die, and a circuit substrate, wherein the circuit substrate comprises:
an insulation layer;
a metal layer disposed on a first surface of the insulation layer; and
a first solder pad and a second solder pad disposed on a second surface of the insulation layer opposite the metal layer,
wherein a soldering dot is positioned on an outer surface of the metal layer further away from the first surface of the insulation layer,
wherein a vertical projection of the soldering dot taken along a thickness direction of the circuit substrate touches the second solder pad,
wherein the vertical projection of the soldering dot taken along the thickness direction of the circuit substrate also touches the first solder pad,
wherein the first solder pad is connected to the metal layer through a first through-hole, the second solder pad is connected to the metal layer through a second through-hole, the second through-hole is shorter in length than the first through-hole and is spaced apart from the first through-hole, and
wherein a first projected area of the first solder pad includes a concave surface to receive a convex surface of a second projected area of the second solder pad.

\* \* \* \* \*